(12) United States Patent
Gurr

(10) Patent No.: US 6,781,373 B2
(45) Date of Patent: Aug. 24, 2004

(54) WATER CHOPPED DUAL-BAND SELECTIVE EXCITATION

(75) Inventor: David H. Gurr, Palo Alto, CA (US)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/304,489

(22) Filed: Nov. 26, 2002

(65) Prior Publication Data
US 2004/0100259 A1 May 27, 2004

(51) Int. Cl.⁷ .................................................. G01V 3/00
(52) U.S. Cl. .................................................... 324/307
(58) Field of Search .............................. 324/300, 307, 324/309, 310, 312; 600/410

(56) References Cited

U.S. PATENT DOCUMENTS

| | | | | |
|---|---|---|---|---|
| 4,714,885 A | * | 12/1987 | Paltiel et al. | 324/312 |
| 5,283,526 A | * | 2/1994 | Spielman et al. | 324/309 |
| 5,500,593 A | * | 3/1996 | Loncar et al. | 324/307 |
| 5,578,921 A | * | 11/1996 | Morrell | 324/307 |
| 5,657,757 A | * | 8/1997 | Hurd et al. | 600/413 |
| 5,729,138 A | * | 3/1998 | Purdy et al. | 324/309 |
| 5,810,726 A | * | 9/1998 | Van Vaals et al. | 600/410 |
| 5,879,299 A | * | 3/1999 | Posse et al. | 600/410 |
| 6,046,589 A | * | 4/2000 | Lamerichs et al. | 324/309 |
| 6,175,236 B1 | * | 1/2001 | Zhou et al. | 324/307 |
| 6,275,040 B1 | * | 8/2001 | Zur | 324/320 |
| 6,304,084 B1 | * | 10/2001 | Star-Lack et al. | 324/307 |
| 6,373,249 B1 | * | 4/2002 | Kwok et al. | 324/306 |

OTHER PUBLICATIONS

Dwight G. Nishimura, Principles of Magnetic Resonance Imaging; Dept. of Electrical Engineering Stanford University; pp. 87–90, 177–187, Apr. 1996.

* cited by examiner

Primary Examiner—Diego Gutierrez
Assistant Examiner—Dixomara Vargas
(74) Attorney, Agent, or Firm—Fletcher Yoder (57) ABSTRACT

A technique is provided whereby a solvent spectrum may be displaced from a spectrum of interest using magnetic resonance spectroscopic imaging. The technique utilizes exciting the subject matter with alternating RF pulse sequences. The alternating RF pulse sequences are configured such that the phase of the frequency component corresponding to the solvent is offset each alternation by an amount, typically 180°, which results in full spatial separation of the solvent signal from the signal of interest after processing.

32 Claims, 8 Drawing Sheets

| LOCATION | RF PROFILE | ODD/EVEN | EXCITATION | $DBSS_M$ | $DBSS_W$ |
|---|---|---|---|---|---|
| 0,0,0 | 1 | ODD | ORDINARY | 90 /180 /180 | 10 /180 /180 |
| 0,0,0 | 2 | EVEN | CHOPPED | 90 /180 /180 | -10 /180 /180 |
| 1,0,0 | 1 | EVEN | CHOPPED | 90 /180 /180 | -10 /180 /180 |
| 1,0,0 | 2 | ODD | ORDINARY | 90 /180 /180 | 10 /180 /180 |
| 0,1,0 | 1 | EVEN | CHOPPED | 90 /180 /180 | -10 /180 /180 |
| 0,1,0 | 2 | ODD | ORDINARY | 90 /180 /180 | 10 /180 /180 |
| 1,1,0 | 1 | ODD | ORDINARY | 90 /180 /180 | 10 /180 /180 |
| 1,1,0 | 2 | EVEN | CHOPPED | 90 /180 /180 | -10 /180 /180 |

FOV

FIG. 14

WATER CHOPPED DUAL-BAND SELECTIVE EXCITATION

BACKGROUND OF THE INVENTION

The invention relates to magnetic resonance spectroscopy. More particularly, the invention relates to a technique for obtaining spectroscopic data in which a solvent signal is shifted away from the signal of interest by differential excitation of the solvent relative to the non-solvent. The solvent signal is spatially separated from the signal of interest but is still available to provide information useful for corrective algorithms.

Magnetic resonance imaging (MRI) techniques are common in the field of diagnostic medical imaging. The MRI modality subjects a subject to a uniform magnetic field upon which various gradient fields have been superimposed. The uniform magnetic field homogenizes the spins of responsive material within the object such that the spins are effectively aligned. An excitation RF pulse is then applied to synchronize the spins of the responsive material by directionally "tipping" the spins into a plane transverse to the uniform magnetic field. Upon removal of the excitation RF pulse, the spins realign with the uniform magnetic field and, in the process, emit a resonance signal. Differences in these resonance signals attributable to each nuclear species are detected by the imaging system and are processed to produce the magnetic resonance image. In the field of medical imaging the responsive material is typically hydrogen and, for simplicity's sake, hydrogen will be discussed as an exemplary responsive material hereinafter. However it should be realized that hydrogen is not the only responsive material and that the following comments apply to other such responsive materials as well.

When hydrogen is a constituent of a molecule, the electron cloud of the molecule affects the magnetic field strength experienced by the hydrogen nuclei. The variation in the effective magnetic field strength predictably results in a small change to the precession frequency, or spin, of the responsive material. This variation in the precession frequency is manifested as a chemical shift which is different for different hydrogen containing molecules. This chemical shift allows different chemicals within the body to be identified and allows the concentration of such chemicals to be determined. A gradient magnetic field applied in addition to the static field will produce a spatially dependent frequency shift to all the chemical spectra, allowing their localization within the field of view. In particular, a Fourier transformation may be employed to calculate a chemical shift spectrum from the resonance signal, decomposing the signal into its frequency components and spatial with each frequency corresponding to a component of a specific chemical and a specific location in space. The spectroscopic and spatial information thereby obtained may be utilized in the fields of magnetic resonance spectroscopy (MRS) or magnetic resonance spectroscopic imaging (MRSI) depending on whether data is obtained in one dimension or more than one dimension respectively.

However, these spectroscopic imaging techniques utilizing hydrogen nuclei may be problematic when applied to the human body due to the presence of such hydrogen nuclei in highly prevalent water and lipids. In particular, the hydrogen found in water and in lipids can produce very strong resonance signals which can mask the resonance signal of a lower concentration compound of interest, usually metabolites such as choline, lactate, or creatine.

In the field of MRS and MRSI, the suppression of the water and lipid signals, known as solvent suppression, is one way in which the resonance signals of compounds of interest may be enhanced. Examples of suppressive techniques include chemical shift selective (CHESS) saturation and short-time inversion recover (STIR) for water and lipid suppression respectively. While these are helpful, they are not completely satisfactory due to their sensitivity to various factors, including local RF magnetic field variations.

It is also known in the field of MRS and MRSI that spectral-spatial pulses may be utilized which are selective in space and in frequency. These spectral-spatial pulses synchronize the refocusing pulses with the time varying magnetic field gradients to provide the desired spatial and frequency selectivity. In general, these spectral-spatial pulses can be designed to avoid the excitation of unwanted chemical species, and may thereby be used to avoid or minimize a resonance signal from water or lipids. One technique used in MRS and MRSI is to employ two spectral-spatial pulses as the final two pulses of a point resolved spectroscopy (PRESS) sequence, i.e. a 90° tip angle RF pulse followed by two 180° refocusing pulses. While this technique will suppress the undesired water and lipid signal, components of the undesired water and lipid signal will continue to contaminate the signal of interest, producing erroneous frequency and concentration information. One current technique is to perform two separate acquisitions, one with water suppression and one without. The two separate data sets may then be used to perform artifact removal algorithms, i.e. $B_0$ correction, and water subtraction to enhance the signal of interest, though acquisition time is significantly increased due to the second acquisition.

Dual-band selective excitation is another technique used in MRS and MRSI. In dual-band selective excitation the water and non-water parts of the sample are differentially excited such that the water is only partially excited relative to the metabolites or other compound of interest. The resulting spectra therefore have a reduced water signal relative to the metabolites. However, even this reduced water signal interferes with the metabolite signal and prevents the application of artifact removing algorithms. Some water signal is desired however, to provide frequency information and for reference purposes during image reconstruction. Ideally, the information provided by the water signal would be available, but would not contaminate the signal of interest. A technique is therefore needed which allows for the separation of the water signal from the signal of interest.

BRIEF DESCRIPTION OF THE INVENTION

The invention provides a method by which a solvent spectrum may be displaced from a spectrum of interest. In accordance with one aspect of the technique, first and second RF pulse sequences are applied to a sample in an alternating fashion. A resonance data set resulting from each pulse sequence is acquired before applying the alternating pulse sequence and the resonance data sets are processed to produce the spectrum of interest.

In accordance with another aspect of the present technique, a method is provided for forming a magnetic resonance spectroscopic image. The method includes applying a first RF pulse sequence and a second RF pulse sequence to a sample in an alternating fashion for a prescribed number of iterations. A resonance data set resulting from each pulse sequence is acquired before applying the alternating pulse. An acquisition matrix is formed from the resonance data sets and is processed. The processed matrix is used to construct a spectroscopic image.

In accordance with another aspect of the present technique, a magnetic resonance spectroscopy imaging system is provided. The system includes a magnetic resonance scanner, one or more control and acquisition circuits operably connected to the scanner, system controller circuitry operably connected to the one or more control and acquisition circuits, and an operator interface station operably connected to the system controller circuitry. The system controller circuitry is configured to apply a first RF pulse sequence and a second RF pulse sequence to a sample in an alternating fashion, to acquire a resonance data set resulting from each pulse sequence before applying the alternating pulse, and to process the resonance data sets to produce a spectrum of interest.

In accordance with another aspect of the present technique, a computer program for displacing a solvent spectrum relative to a spectrum of interest is provided. The computer program includes a machine readable medium for supporting machine readable code and configuration code stored on the machine readable medium. The configuration code contains instructions for applying a first RF pulse sequence and a second RF pulse sequence to a sample in an alternating fashion. The first RF pulse sequence has a frequency component at a first phase and the second RF pulse sequence has the frequency component at a second phase offset from the first phase.

In accordance with another aspect of the present technique, a magnetic resonance spectroscopy imaging system is provided. The system includes a magnetic resonance scanner, one or more control and acquisition circuits operably connected to the scanner, system controller circuitry operably connected to the one or more control and acquisition circuits, and an operator interface station operably connected to the system controller circuitry. The system controller circuitry comprises a means to produce a magnetic resonance spectroscopic image in which a solvent spectrum is displaced from a spectrum of interest.

BRIEF DESCRIPTION OF THE DRAWINGS

The foregoing and other advantages and features of the invention will become apparent upon reading the following detailed description and upon reference to the drawings in which.

DETAILED DESCRIPTION OF SPECIFIC EMBODIMENTS

Figure 1:
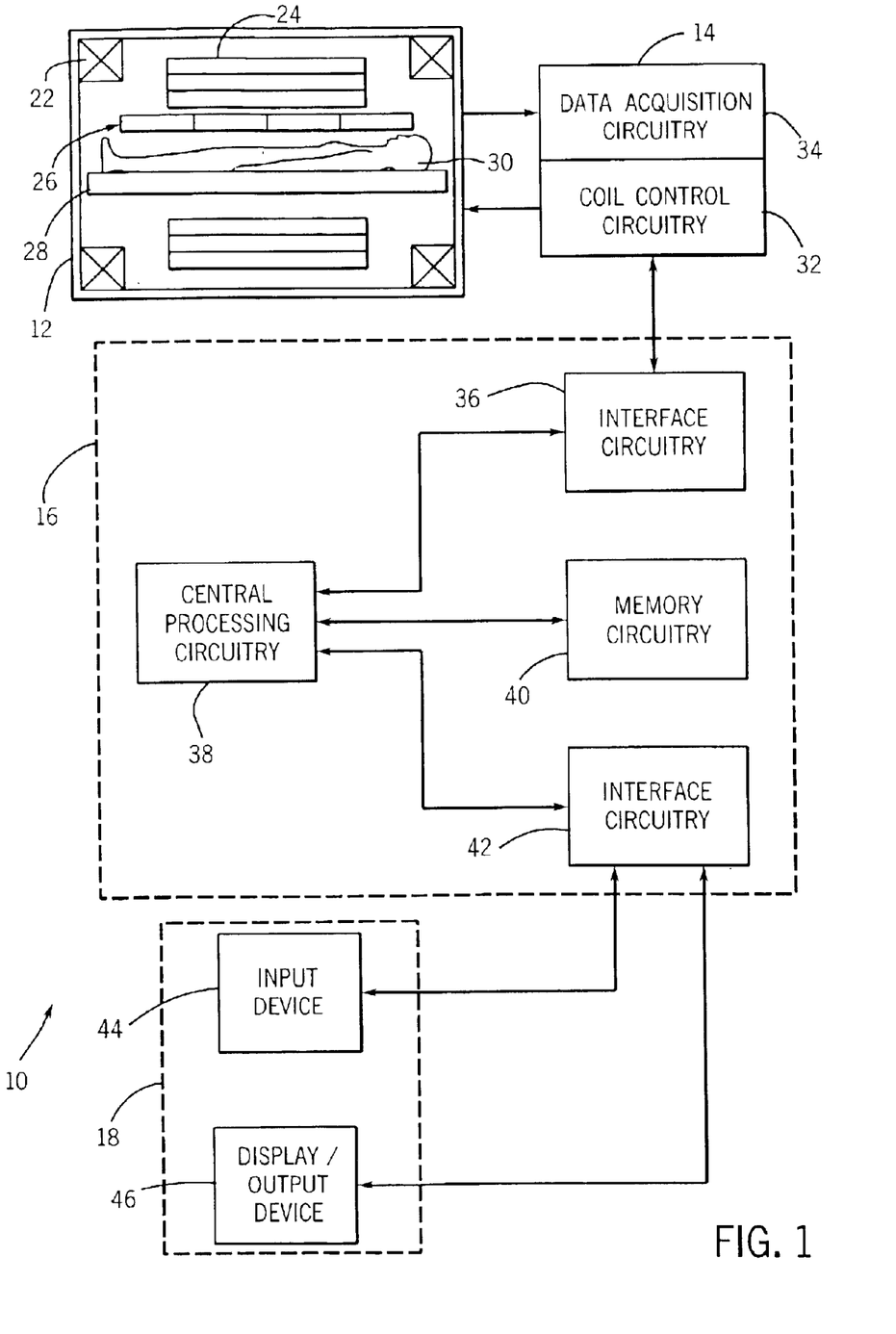
FIG. 1 is a diagrammatical representation of a magnetic resonance imaging system for use with magnetic resonance spectroscopic imaging.

Referring now to FIG. 1, a magnetic resonance imaging system, designated generally by the reference numeral 10, is illustrated as including a scanner 12, control and acquisition circuitry 14, system controller circuitry 16, and an operator interface station 18. The scanner 12, in turn, includes coil assemblies for selectively generating controlled magnetic fields used to excite spin systems in a subject of interest. In particular, the scanner 12 includes a primary coil 22, which will typically include a superconducting magnet coupled to a cryogenic refrigeration system (not shown). The primary coil 22 generates a highly uniform magnetic field along a longitudinal axis of the scanner. A gradient coil assembly 24 consisting of a series of gradient coils, and a RF transmit coil 26 is also provided for generating controllable magnetic fields having desired orientations with respect to the subject of interest. In particular, as will be appreciated by those skilled in the art, the gradient coil assembly 24 produces fields in response to pulsed signals for selecting an image slice, orienting the image slice, and encoding excited spin systems within the slice to produce the desired image.

In the illustrated embodiment, RF transmit coil 26 also serves as a receiving coil assembly for detecting emissions from spin systems during data acquisition phases of operation of the system. A table 28 is positioned within the scanner 12 to support a subject 30. While a full body scanner is illustrated in the exemplary embodiment of FIG. 1, the technique described below may be equally well applied to various alternative configurations of systems and scanners, including smaller scanners, and scanners incorporating single channel, phased array and similar receiving coil structures. Moreover, the signal combining techniques described below may find application outside of the field of magnetic resonance imaging, and outside of the field of medical imaging in general.

In the embodiment illustrated in FIG. 1, the control and acquisition circuitry 14 includes coil control circuitry 32 and data acquisition circuitry 34. The coil control circuitry 32 receives pulse sequence descriptions from the system controller 16, notably through the interface circuitry 36 included in the system controller 16. As will be appreciated by those skilled in the art, such pulse sequence descriptions generally include digitized data defining pulses for exciting the gradient coil assembly 24 during excitation and data acquisition phases of imaging. Fields generated by the RF coil assembly 26 excite the spin system within the subject 30 to cause emissions from the material. Such emissions are detected by a RF coil assembly 26 and are filtered, amplified, and transmitted to data acquisition circuitry 34. Data acquisition circuitry 34 may perform preliminary processing of the detected signals, such as amplification of the signals. Following such processing, the amplified signals are transmitted to the interface circuitry 36 for further processing.

In addition to the interface circuitry 36, the system controller 16 includes central processing circuitry 38, memory circuitry 40, and workstation interface circuitry 42 for communicating with the operator interface station 18. In general, the central processing circuitry 38, which will typically include a digital signal processor, a CPU or the like, as well as associated signal processing circuitry, commands excitation and data acquisition pulse sequences for the scanner 12 and the control and acquisition circuitry 14 through the intermediary of the interface circuitry 36. The central processing circuitry 38 also processes image data received via the interface circuitry 36, to perform 2D Fourier transforms to convert the acquired data from the time domain to the frequency domain, and to reconstruct the data into a meaningful image. The memory circuitry 40 serves to save such data, as well as pulse sequence descriptions, configuration parameters, and so forth. The workstation interface circuitry 42 permits the system controller 16 to receive and transmit configuration parameters, image protocol and command instructions, and so forth.

The operator interface station 18 includes one or more input devices 44, along with one or more display or output devices 46. In a typical application, the input device 44 will include a conventional operator keyboard, or other operator input devices for selecting image types, image slice orientations, configuration parameters, and so forth. The display/output device 46 will typically include a computer monitor for displaying the operator selections, as well as for viewing scanned and reconstructed images. Such devices may also include printers or other peripherals for reproducing hard copies of the reconstructed images.

Figure 2:
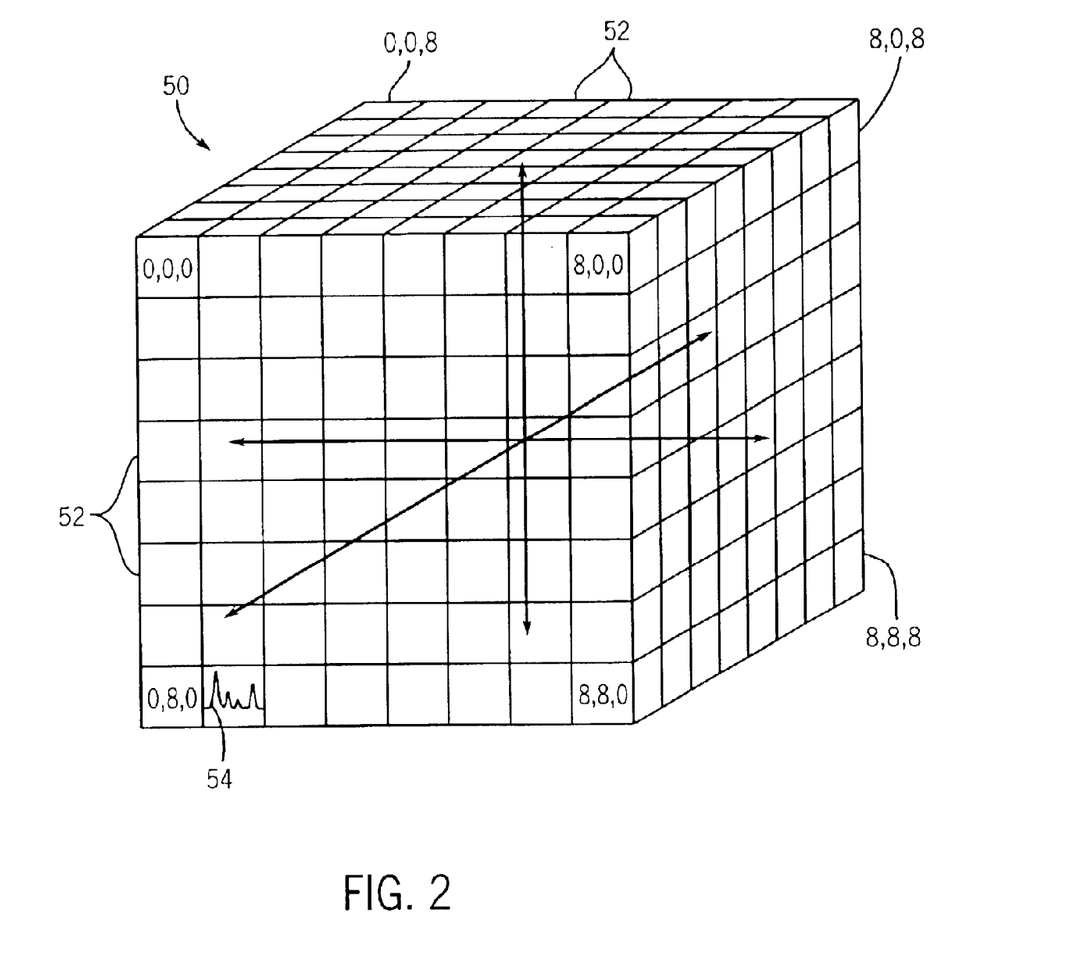
FIG. 2 is graphical depiction of a reconstructed data set associated with a chemical shift imaging volume of a magnetic resonance imaging system.

The system 10 of FIG. 1 may be used to acquire imaging information from a subject within a particular imaging volume located within or about the subject. An idealized imaging volume, represented as a cube 50, is depicted in FIG. 2. The cube 50 comprises an assortment of three-dimensional voxels 52, represented as unit cubes. Each imaging region of the subject represented by a voxel 52 conveys information regarding location, here represented by a three-dimensional coordinate system, i.e. 0,8,0, etc., derived by the operation of the gradient coil assembly 24. In addition, each voxel 52 conveys information regarding the chemical composition of the imaging region of the subject represented by the voxel 52. This information takes the form of a spectrum 54 of resonance frequency information which can be decomposed to determine chemical composition and concentration within the imaged region. The spectrum 54 may be represented as providing frequency information along the "x-axis" and concentration information along the "y-axis". Though only one spectrum 54 is depicted in FIG. 2 for diagrammatic purposes, each voxel 52 of the imaging volume contains such spectral information.

Figure 3:
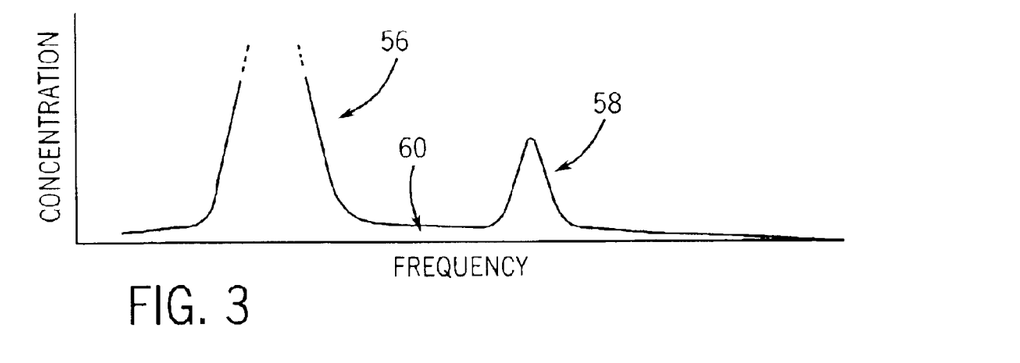
FIG. 3 is a graphical representation of a frequency spectrum associated with pure water.
Figure 4:
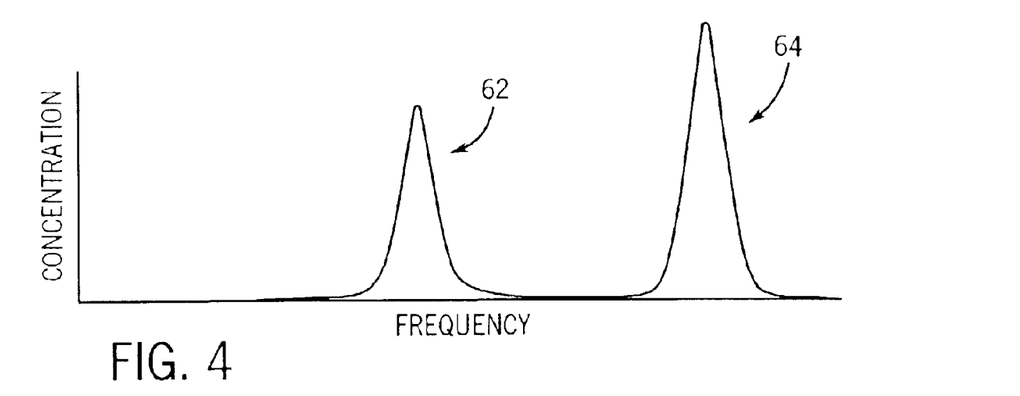
FIG. 4 is a graphical representation of a frequency spectrum associated with pure metabolites, such as choline and citrate.
Figure 5:
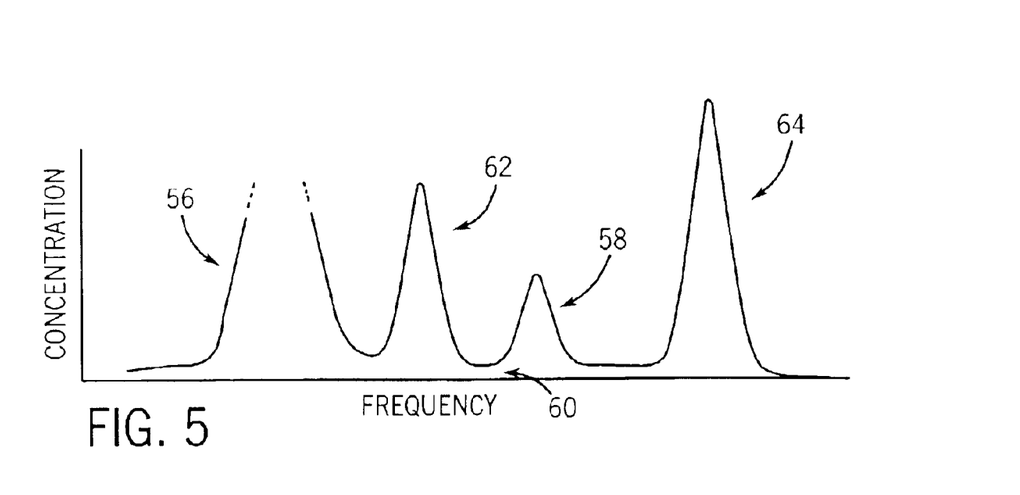
FIG. 5 is a graphical representation of a combined frequency spectrum associated with metabolites in a water solvent.

An example of such spectral information can be seen in FIGS. 3, 4, and 5, which respectively depict the spectrum of water, of metabolites, and of water combined with metabolites. As discussed above, the placement of peaks along the x-axis is indicative of frequency, with peaks at a given frequency being indicative of a particular molecule. The height of the peak along the y-axis is indicative of the concentration of the molecules present. Referring now to FIG. 3, the spectrum of water can be seen as comprising a large main peak 56 and a smaller artifact peak, or sideband, 58. The sideband 58 is a "ghost" image of the main peak 56 and typically results from machine imperfections, such as eddy currents, which produce some chemical shift within portions of the imaged volume. In addition, a raised baseline, or "water wings," 60 is typically present around the main water peak 56. FIG. 4, in comparison, represents a typical spectrum of the metabolites choline and citrate, represented by peaks 62 and 64 respectively, in the absence of water.

The combination of the water and metabolites in the imaging volume, however, produces the combined spectrum of FIG. 5. As can be seen in FIG. 5, the main water peak 56 dwarfs the metabolite peaks 62, 64. In addition, the water sideband 58 may become confounded with the citrate peak 64, leading to interpretation difficulties. Further, the choline peak 62 is located upon the water wing 60 associated with the main water peak 56, leading to an overestimation of the concentration of choline within the imaged volume.

One technique for reducing these water-related effects within a MRS sample is to employ dual-band selective excitation to differentially excite the water and non-water portions within the imaging volume. The differential excitation provides full excitation for the molecules of interest, i.e. metabolites, within the sample while only partially exciting water within the sample. The resulting spectra have a reduced water signal and therefore have reduced artifacts related to the water signal. With dual-band selective excitation however, the water artifacts still are present and disrupt the metabolite signal. Additionally, because the water signals are confounded with the metabolite signals, i.e. the peaks and wings occur at the same or contiguous frequencies as the metabolite signals, artifact removal algorithms such as $B_0$ correction or water subtraction may not be applied or may have less than optimal results.

Figure 6:
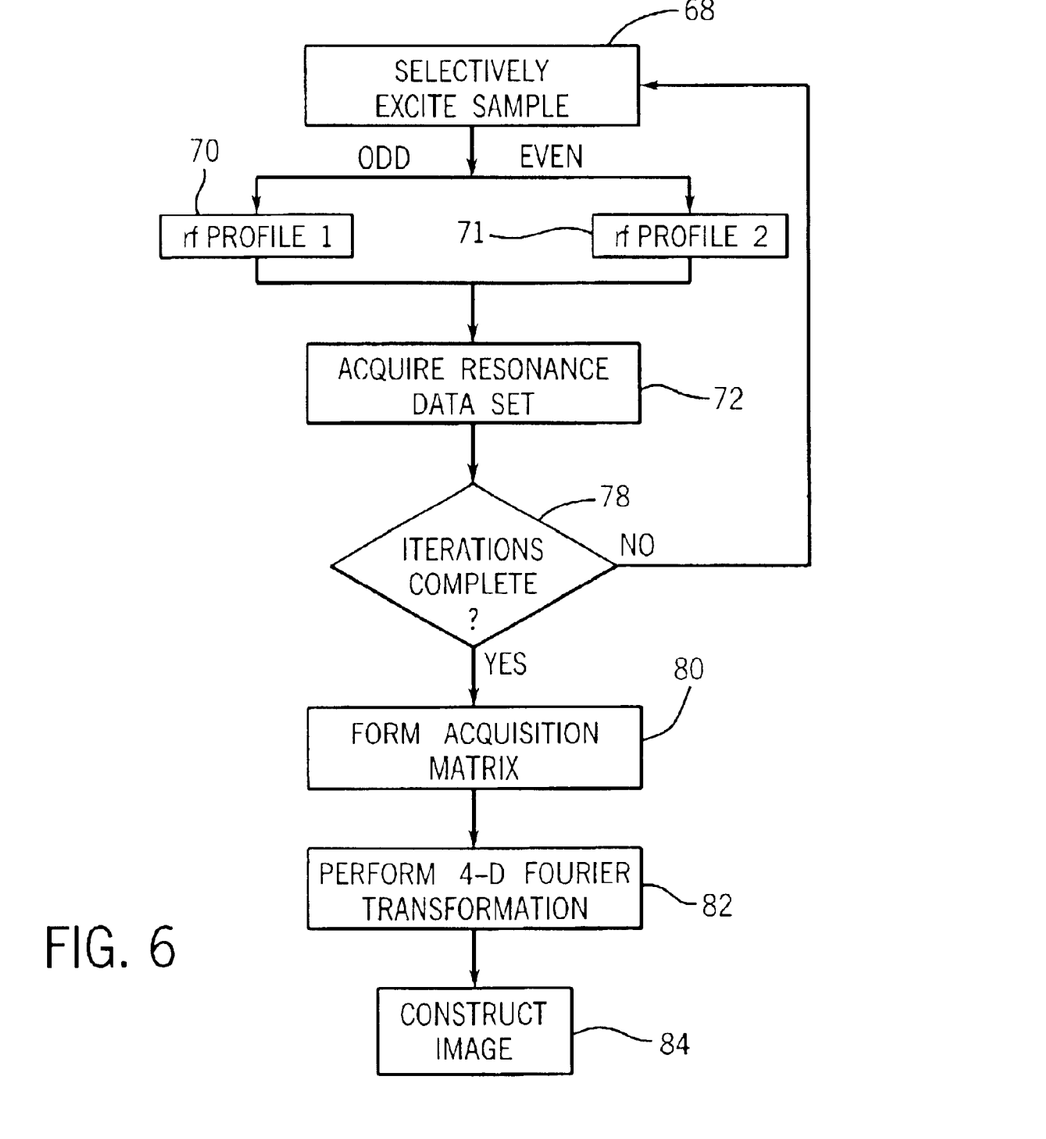
FIG. 6 is a block diagram representing the process of creating a "water-chopped" magnetic resonance spectrographic image.

An alternative technique which more effectively removes the water signal from the metabolite signal is depicted in FIG. 6. The alternative technique presented spatially shifts the water signal away from the metabolite signal or other signals during a chemical shift imaging (CSI) acquisition, allowing effective separation and removal of the water signal. As depicted in block 68, the sample is differentially excited using dual-band spectral-spatial pulses. The differential excitation is further differentiated by odd and even acquisitions, as represented by blocks 70 and 71, such that different RF pulse profiles are applied during the odd and even acquisition periods. In particular, phase encoding is utilized to separate the water signal from the signals of interest. For example, each alternating RF profile 70, for example the odd acquisitions, is "chopped" relative to the alternate, or ordinary, RF profile 71, i.e. the even acquisitions. For example, during ordinary CSI encoding, the metabolite excitation phase and water excitation phase might be represented by M and W respectively. However during "chopped" CSI encoding, such as during odd acquisitions, the metabolite excitation phase might remain M however the water excitation phase would be (W+$\pi$). The resonance data is acquired after each excitation, as depicted at block 72, for subsequent processing and transformation. After Fourier transformation of these acquisitions, the water signal will be spatially shifted away from the metabolite signal or other signals of interest. In an exemplary embodiment, the water signal is shifted half a field of view away from the signals of interest. While the described embodiment employs an alternating pair of pulses, more than two pulses, i.e. a sequence of pulses, may be employed to offset the water signal from the signals of interest using this technique.

Figure 7:
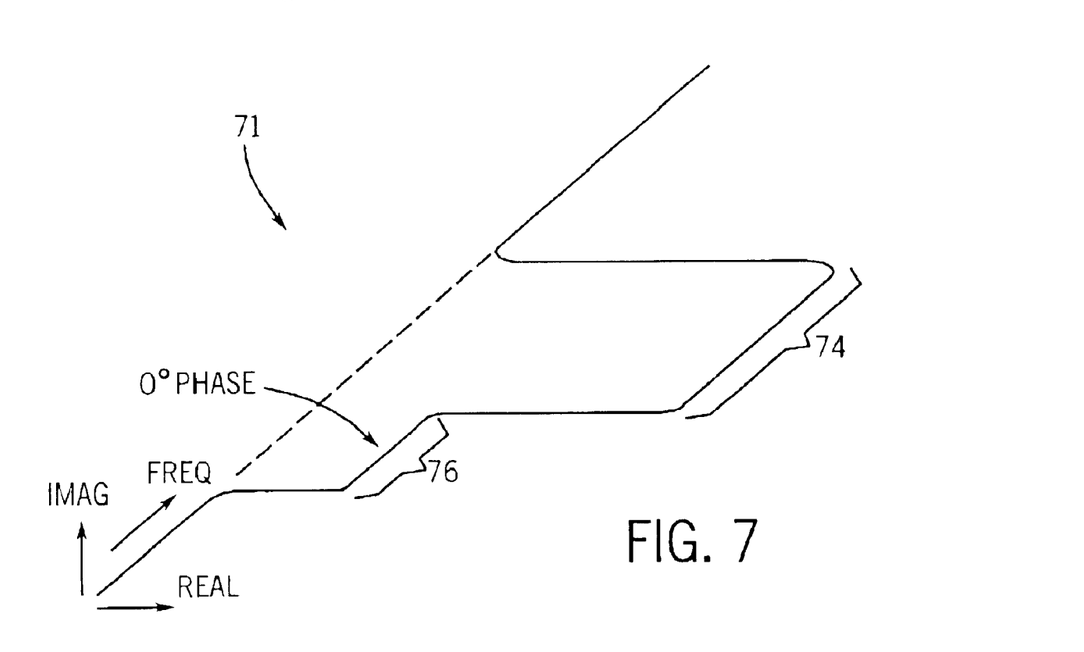
FIG. 7 is a graphical representation of the excitation profile of an ordinary dual-band spectral-spatial excitation pulse.
Figure 8:
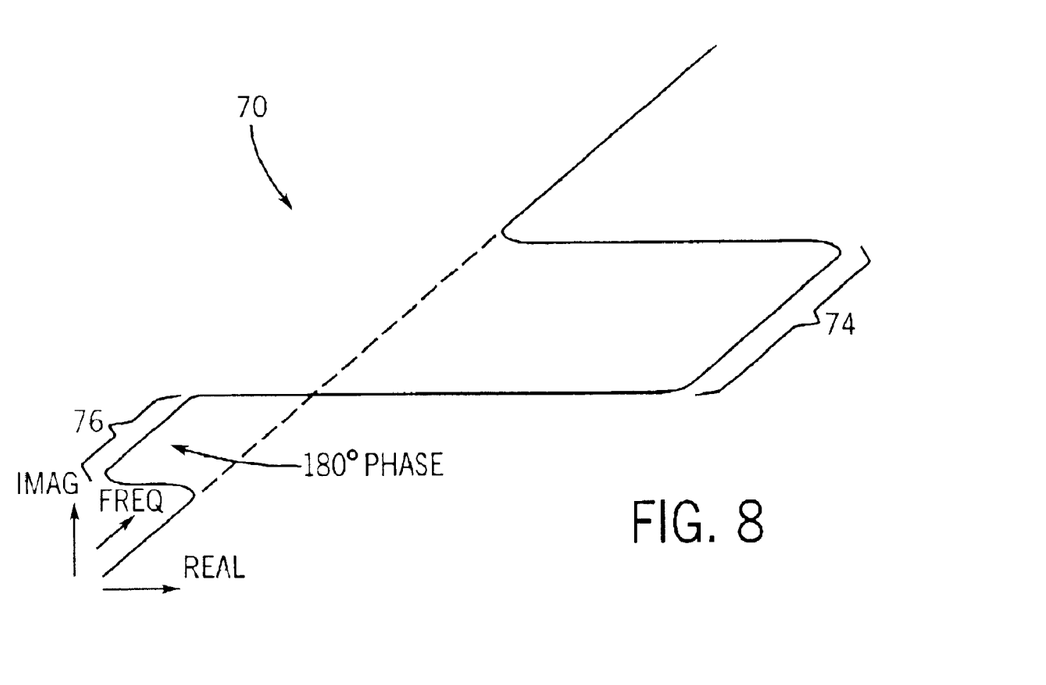
FIG. 8 is a graphical representation of the excitation profile of a "chopped" dual-band spectral-spatial excitation pulse.
Figure 9:
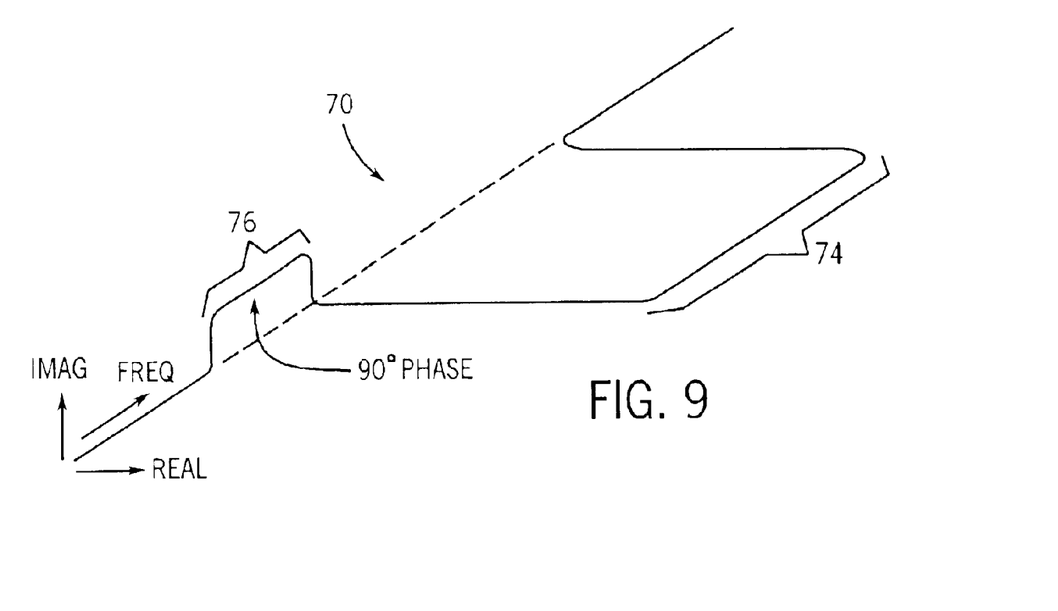
FIG. 9 is a graphical representation of the excitation profile of an alternative ordinary dual-band spectral-spatial excitation pulse.
Figure 10:
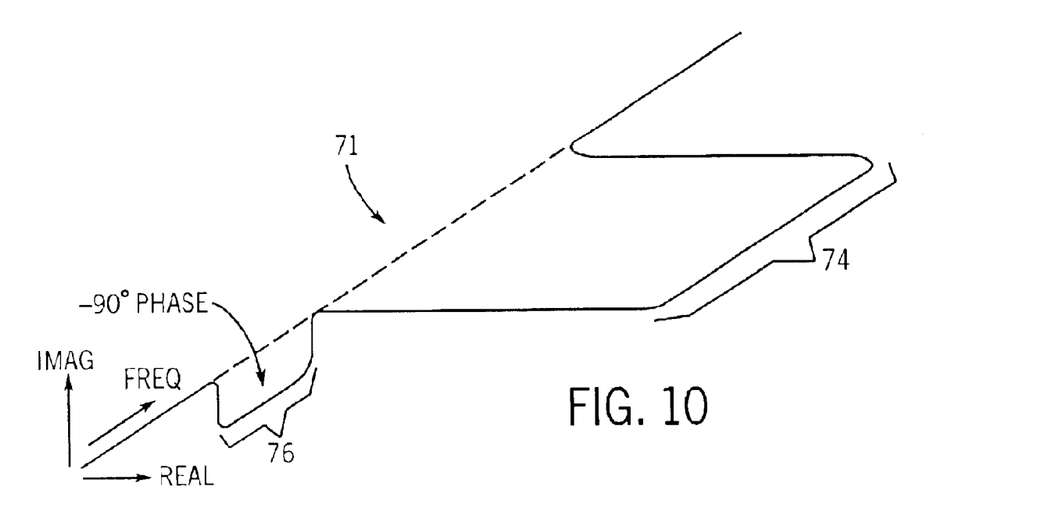
FIG. 10 is a graphical representation of an alternative chopped dual-band spectral-spatial excitation pulse.

A graphical depiction of the ordinary and chopped RF pulse profiles, 70, 71 can be seen in FIGS. 7 and 8 as well as in FIGS. 9 and 10. FIG. 7 depicts an exemplary excitation profile of an ordinary dual-band spectral-spatial pulse 71 in three-dimensions. The metabolite chemical shift passband 74 and the water chemical shift passband 76 both have a 0° mutual phase shift though the metabolite passband 74 is of a greater magnitude than the water passband 76, due to the use of selective excitation. Conversely, an exemplary excitation profile of a "chopped" dual-band spectral-spatial 70 pulse is depicted in FIG. 8 and can be seen to possess a water passband 76 at 180° phase shift relative to the water passband 76 of FIG. 7. Because of the configuration of RF pulse profiles 70 and 71, the phase of the water signal changes between odd and even acquisitions.

An alternative but equivalent pair of ordinary and chopped RF pulse profiles 70, 71 are depicted in FIGS. 9 and 10. In the alternative ordinary RF pulse 70, the water passband 76 has a 90° phase shift relative to the metabolite passband 74. Likewise, in the alternative chopped RF pulse 72, the water passband 76 has a −90° phase shift relative to the metabolite passband 74 and a 180° phase shift relative to the water passband 76 of the ordinary RF pulse 70. As depicted, the water passbands 76 of FIGS. 7 and 8 are represented as real numbers while the water passbands 76 of FIGS. 9 and 10 are represented as imaginary numbers. Though the opposing water passbands 76 depicted in FIGS. 7 and 8 and in FIGS. 9 and 10 differ in phase, they are of equal amplitude in the embodied configurations. Clearly, due to the complex nature of the phase relationships in question, the phase of water passbands 76 may be any complex number as long as the odd and even water passbands 76 are out of phase with one another, such as by 180°.

Figure 11:
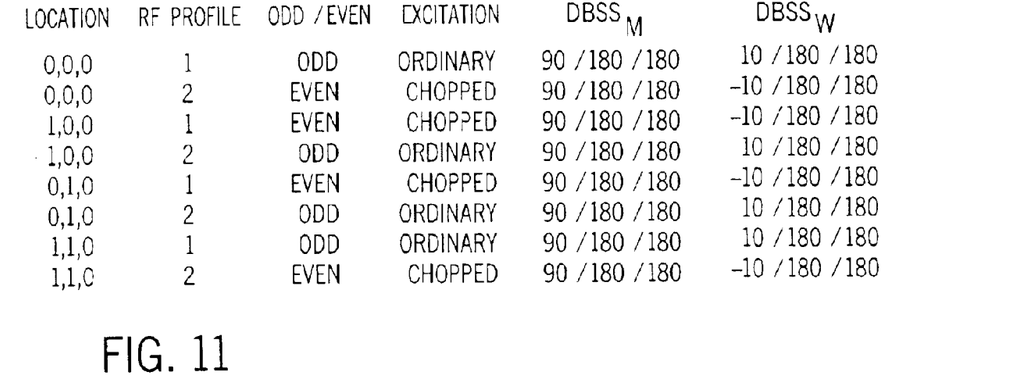
FIG. 11 is a table representing the dual-band spectral-spatial excitation pulses applied to an imaging volume in accordance with the present technique.

For example, referring now to FIG. 11, a table is provided demonstrating a possible arrangement for coordinating the excitation of an imaging volume. During the first acquisition sequence, for instance, voxel 0,0,0 is excited by the first RF profile, i.e., ordinary excitation. If dual-band spectral-spatial pulses are employed, the metabolite in the imaging volume is exposed a 90° spectral-spatial pulse, followed by two 180° refocusing pulses, (90/180/180). However, the water in the imaging volume is exposed to a reduced spectral-spatial pulse with normal refocusing pulses, i.e. 10/180/180. Because the water is exposed to a lesser spectral-spatial pulse, it is not fully tipped into the transverse plane and, therefore, produces a reduced signal upon relaxation.

The second acquisition sequence to which each voxel, e.g. voxel 0,0,0, is exposed, i.e. the even acquisition, is different from the first. In particular, the second RF profile again excites the metabolite using a 90/180/180 profile. However, the water is excited using a "chopped" pulse of −10/180/180. It is not necessary that the water signal be differentially excited, i.e. attenuated, by employing such reduced excitation to practice the present technique, because the use of alternating ordinary and chopped excitation will still effectively shift the water signal away from the metabolite signal. With these comments in mind and referring once again to FIG. 11, a current embodiment of the technique utilizes selective excitation of the metabolite and water within the imaging volume.

Referring once again to FIG. 6, the sample is iteratively excited by the alternating sequence of RF profiles 70 and 71 until a set number of odd/even iteration cycles has been reached, as determined at decision block 78. Once the set number of iterations has been reached for each voxel in the imaging volume, i.e. the cube 50, an acquisition matrix is formed, as depicted at block 80. A four-dimensional fast Fourier transformation is then performed on the acquisition matrix, as depicted in block 82, which provides three-dimensional location information and frequency (i.e. spectral) information for the data. An image can then be constructed from the transformed data, as indicated at block 84.

Figure 12:
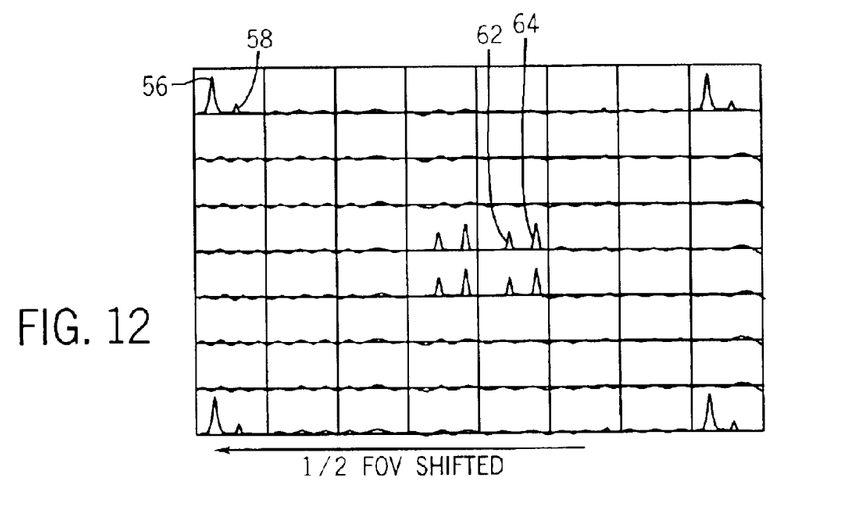
FIG. 12 is a representation of spatially separated water and metabolite spectra using magnetic resonance spectroscopic imaging according to the present technique.
Figure 13:
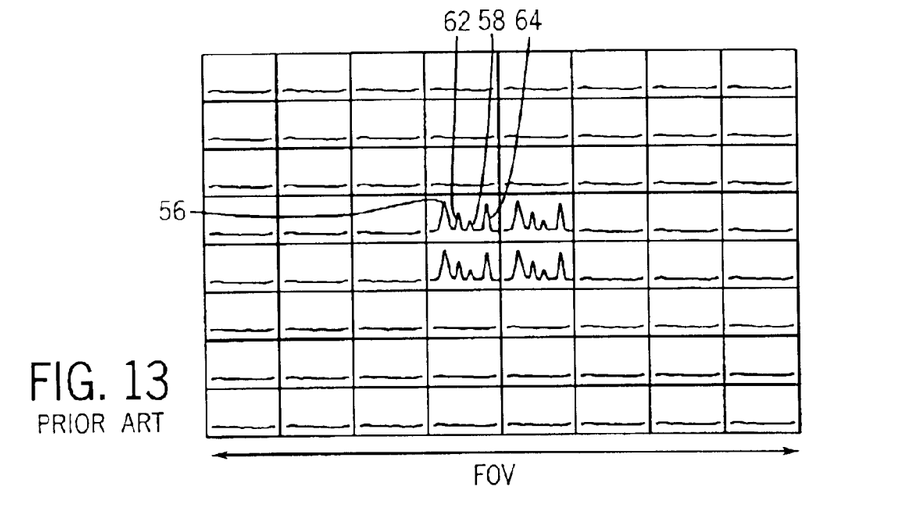
FIG. 13 is a prior art representation of a combined spectrum for metabolite in a water solvent using magnetic resonance spectroscopic imaging.

A two-dimensional slice of the resulting three-dimensional voxel image volume is depicted in FIG. 12 and a similar slice resulting from prior techniques is depicted in FIG. 13. Referring first to FIG. 13, it can be seen that, using previous techniques, the combined water and metabolite spectra are confounded within the field of view of the imaging volume at the location of the subject. Even if other techniques are employed to suppress the water signal, the spectra remain confounded. Referring now to FIG. 12, a slice of the resulting image clearly demonstrates that the water and metabolite spectra are spatially separated within the field of view of the imaging volume, with the water spectrum being shifted half of a field of view away in both dimensions of a two-dimensional slice. In the three-dimensional imaging volume, the water spectrum can be seen to be shifted half a field of view away from the metabolite spectrum in all three spatial dimensions.

Figure 14:
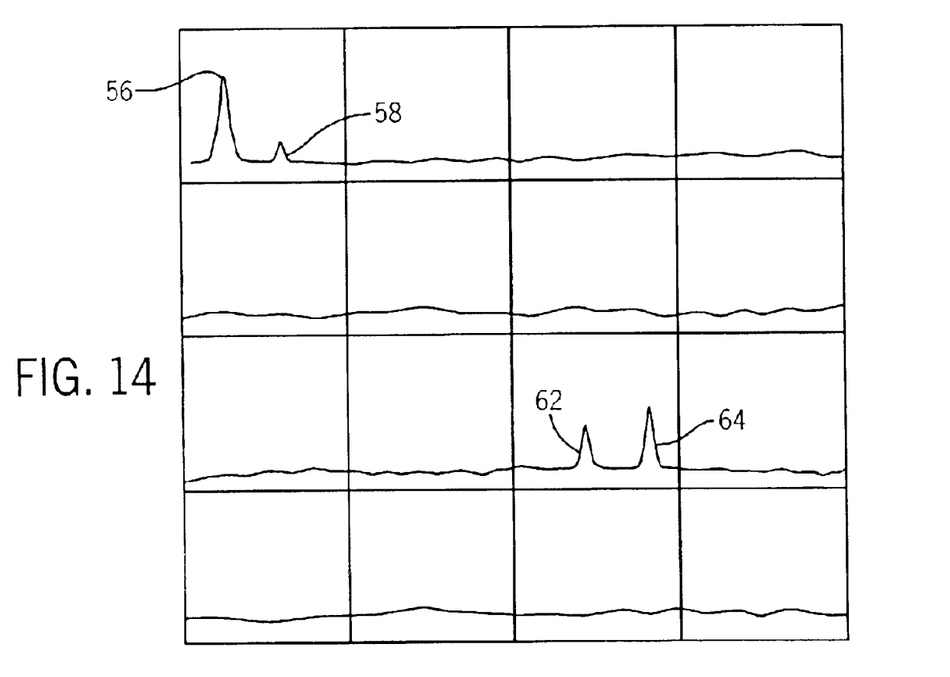
FIG. 14 is an alternative representation of spatially separated water and metabolite spectra using magnetic resonance spectroscopic imaging according to the present technique.

As can be seen in FIG. 12, the water signal is actually split between the four corners of the slice, or presumably the eight corners of the three-dimensional volume. If, however, it is desired to maintain the water signal in a single region of the field of view, the water spectrum may be localized in a corner relative to the metabolite spectrum or in any other manner which maintains spatial separation of the spectra, as depicted in FIG. 14. As long as the sample signal of interest is less than one half of a field of view in width, the water signal and its artifacts, i.e. the main water peak 56, the water sideband 58 and the water wing 60, will be spatially separated from the signal of interest, in this example, the choline peak 62 and the citrate peak 64. The signal of interest will therefore be free of distortion from the water signal, yielding superior spectra from a single data set, i.e., with no increase in the acquisition time. Further, the remaining water signal is available to provide information during image reconstruction and can later be removed via various artifact removal or suppression techniques, such as $B_0$ correction, if desired. While it is preferable that the water excitation phase be shifted by $\pi$ to maximize the separation, if due to RF pulse design constraints this cannot be achieved, a smaller phase shift may still be employed though the resulting water signal shift will also be reduced, requiring a larger field of view to obtain satisfactory separation.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of separating a solvent spectrum from one or more spectra of interest, comprising:
   applying a first spectral-spatial pulse sequence and a second spectral-spatial pulse sequence to a sample in an alternating fashion, wherein the first spectral-spatial pulse sequence comprises a solvent frequency component at a first phase and one or more non-solvent frequency components and wherein the second spectral-spatial pulse sequence comprises the solvent frequency component at a second phase offset from the first phase and the one or more non-solvent frequency components.

2. The method as recited in claim 1, further comprising acquiring a resonance data set resulting from each pulse sequence before applying the alternating pulse sequence.

3. The method as recited in claim 2, further comprising processing the resonance data sets to produce the one or more spectra of interest.

4. The method as recited in claim 3, wherein processing the resonance data sets comprises performing a Fourier transformation of the data sets.

5. The method as recited in claim 3, wherein processing the resonance data sets comprises constructing a spectroscopic image in which the solvent spectrum is spatially separated from the one or more spectra of interest.

6. The method as recited in claim 1, wherein the solvent spectrum comprises a water spectrum and the one or more spectra of interest comprises a metabolite spectrum.

7. The method as recited in claim 1, wherein the second phase is offset from the first phase by 180°.

8. The method as recited in claim 1, wherein the solvent frequency component comprises a water passband.

9. The method as recited in claim 8, wherein the solvent spectrum comprises a water spectrum and the one or more spectra of interest comprises a metabolite spectrum.

10. The method as recited in claim 1, wherein the one or more non-solvent frequency components of the first and second spectral-spatial pulse sequence are equivalent.

11. The method as recited in claim 1, wherein the one or more non-solvent frequency components of the first and second spectral-spatial pulse sequence are offset from each other by a different amount than the first phase and second phase are offset.

12. A method of forming a magnetic resonance spectroscopic image, comprising:
applying a first spectral-spatial pulse sequence and a second spectral-spatial pulse sequence to a sample in an alternating fashion, wherein the first spectral-spatial pulse sequence comprises a solvent frequency component at a first phase and one or more non-solvent frequency components and wherein the second spectral-spatial pulse sequence comprises the solvent frequency component at a second phase offset from the first phase and the one or more non-solvent frequency components;
acquiring a resonance data set resulting from each pulse sequence before applying the subsequent pulse sequence;
forming an acquisition matrix from the resonance data sets;
processing the acquisition matrix; and
constructing a spectroscopic image from the processed matrix.

13. The method of claim 12, wherein the second phase is offset from the first phase by 180°.

14. The method of claim 12, wherein the solvent frequency component comprises a water passband.

15. The method of claim 12, wherein processing the acquisition matrix comprises performing a Fourier transformation of the matrix.

16. The method of claim 12, wherein constructing the spectroscopic image comprises spatially separating a solvent spectrum from one or more spectra of interest.

17. The method of claim 16, wherein the solvent spectrum comprises a water spectrum and the one or more spectra of interest comprises a metabolite spectrum.

18. A magnetic resonance spectroscopy imaging system, comprising:

a magnetic resonance scanner;
one or more control and acquisition circuits operably connected to the scanner;
system controller circuitry operably connected to the one or more control and acquisition circuits, wherein the system controller circuitry is configured to apply a first spectral-spatial pulse sequence and a second spectral-spatial pulse sequence to a sample in an alternating fashion, to acquire a resonance data set resulting from each pulse sequence before applying the subsequent alternating pulse, and to process the resonance data sets to produce one or more spectra of interest, wherein the first spectral-spatial pulse sequence comprises a solvent frequency component at a first phase and one or more non-solvent frequency components and wherein the second spectral-spatial pulse sequence comprises the solvent frequency component at a second phase offset from the first phase and the one or more non-solvent frequency components; and
an operator interface station operably connected to the system controller circuitry.

19. The system of claim 18, wherein the one or more spectra of interest comprises a pure metabolite spectrum.

20. The system of claim 18, wherein the second phase is offset form the first phase by 180°.

21. The system of claim 18, wherein the solvent frequency component comprises a water passband.

22. The system of claim 18, wherein the system controller circuitry processes the resonance data sets by performing a Fourier transformation.

23. The system of claim 18, wherein the system controller circuitry produces the one or more spectra of interest by separating a solvent spectrum from one or more non-solvent spectra.

24. The system of claim 23, wherein the solvent spectrum comprises a water spectrum and the one or more spectra of interest comprises a metabolite spectrum.

25. A computer program for displaying a solvent spectrum relative to one or more spectra of interest, comprising:
a machine readable medium for supporting machine readable code; and
configuration code stored on the machine readable medium for applying a first spectral-spatial pulse sequence and a second spectral-spatial pulse sequence to a sample in an alternating fashion, wherein the first spectral-spatial pulse sequence comprises a solvent frequency component at a first phase and one or more non-solvent frequency components and wherein the second spectral-spatial pulse sequence comprises the solvent frequency component at a second phase offset from the first phase and the one or more non-solvent frequency components.

26. The computer program of claim 25, wherein the second phase is offset from the first phase by 180°.

27. The computer program of claim 25, wherein the solvent frequency component comprises a water passband.

28. The computer program of claim 25, wherein the solvent spectrum comprises a water spectrum and the one or more spectra of interest comprises a metabolite spectrum.

29. The computer program of claim 25, wherein the configuration code is further configured for acquiring a resonance data set resulting from each pulse sequence before applying the alternating pulse sequence, and processing the resonance data sets to produce the one or more spectra of interest.

30. The computer program of claim 29, wherein processing the resonance data sets comprises performing a Fourier transformation of the data sets.

31. A magnetic resonance spectroscopy imaging system, comprising:

a magnetic resonance scanner;

one or more control and acquisition circuits operably connected to the scanner;

system controller circuitry operably connected to the one or more control and acquisition circuits, wherein the system controller circuitry comprises a means for producing a magnetic resonance spectroscopic image in which a solvent spectrum is displaced from one or more spectra of interest; and an operator interface station operably connected to the system controller circuitry.

32. The system of claim 31 in which the solvent spectrum comprises a water spectrum and the one or more spectra of interest comprises a metabolite spectrum.

* * * * *